United States Patent
Fagg et al.

(10) Patent No.: US 8,274,179 B2
(45) Date of Patent: Sep. 25, 2012

(54) PASSIVE DIFFERENTIAL VOLTAGE DOUBLER

(75) Inventors: Russell John Fagg, San Diego, CA (US); Chengzhi Pan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 572 days.

(21) Appl. No.: 12/408,558

(22) Filed: Mar. 20, 2009

(65) Prior Publication Data

US 2010/0237710 A1  Sep. 23, 2010

(51) Int. Cl.
*H02M 3/18* (2006.01)
(52) U.S. Cl. ........................................ 307/110
(58) Field of Classification Search .................. 307/110; 327/536; 363/60, 62; 330/9
See application file for complete search history.

(56) References Cited

U.S. PATENT DOCUMENTS

| | | | |
|---|---|---|---|
| 4,697,152 A * | 9/1987 | Westwick | 330/9 |
| 5,187,421 A * | 2/1993 | Naito | 363/59 |
| 5,237,209 A * | 8/1993 | Brewer | 307/110 |
| 5,262,934 A | 11/1993 | Price | |
| 5,410,270 A * | 4/1995 | Rybicki et al. | 330/9 |
| 5,532,916 A * | 7/1996 | Tamagawa | 363/62 |
| 5,623,222 A | 4/1997 | Tamagawa | |
| 6,304,007 B1 * | 10/2001 | Yu | 307/110 |
| 6,906,577 B2 * | 6/2005 | Kim | 327/536 |
| 6,959,519 B2 * | 11/2005 | Adriaansen | 52/537 |
| 7,940,121 B2 * | 5/2011 | Nomasaki et al. | 330/253 |
| 7,990,742 B2 * | 8/2011 | Lesso | 363/62 |
| 2006/0119438 A1 | 6/2006 | Lin | |
| 2008/0001659 A1 * | 1/2008 | Vaisanen | 330/7 |
| 2008/0136500 A1 * | 6/2008 | Frulio et al. | 327/536 |
| 2010/0201555 A1 * | 8/2010 | Karavidas et al. | 341/143 |

OTHER PUBLICATIONS

International Search Report and Written Opinion—PCT/US2010/028192, International Search Authority—European Patent Office—Jun. 25, 2010.

* cited by examiner

*Primary Examiner* — Daniel Cavallari
(74) *Attorney, Agent, or Firm* — Kevin T. Cheatham

(57) ABSTRACT

Techniques for generating a differential output voltage between first and second output voltages that is double a differential input voltage between first and second input voltages. In one aspect, first and second capacitors of a constituent voltage doubler are charged to a differential input voltage during a charging phase. During an output phase non-overlapping in time with the charging phase, the first and second capacitors are stacked in series to generate the differential output voltage. The first and second capacitors are both coupled to a single common-mode voltage to provide a predefined common-mode output voltage. Further techniques for providing two or more constituent voltage doublers to extend the output phase are described.

20 Claims, 6 Drawing Sheets

PASSIVE DIFFERENTIAL VOLTAGE DOUBLER

TECHNICAL FIELD

The disclosure relates to circuit design and, more particularly, to the design of passive differential voltage doublers.

BACKGROUND

A voltage doubler is used to increase the voltage level in a circuit beyond what is available from a given input voltage. A differential implementation of a voltage doubler generates a differential output voltage that is double the value of a differential input voltage. In certain implementations, when a differential output voltage is passively generated, the common-mode level of the differential output voltage is not well-defined.

It would be desirable to provide a passive differential voltage doubler that has the advantages of providing a well-defined common-mode output voltage as well as being simple to design.

SUMMARY

An aspect of the present disclosure provides an apparatus comprising a differential voltage doubler for generating a differential output voltage between first and second output voltages that is double a differential input voltage between first and second input voltages, the voltage doubler comprising at least one constituent voltage doubler, each of the at least one constituent voltage doubler comprising: a first capacitor having a first terminal and a second terminal, the first and second terminals of the first capacitor configured to be coupled to the first and second input voltages, respectively, during a charging phase of the constituent voltage doubler, the first and second terminals of the first capacitor further configured to be coupled to the first output voltage and a common-mode voltage, respectively, during an output phase of the constituent voltage doubler, the output phase non-overlapping in time with the charging phase; and a second capacitor having a first terminal and a second terminal, the first and second terminals of the second capacitor configured to be coupled to the first and second input voltages, respectively, during the charging phase, the first and second terminals of the second capacitor further configured to be coupled to the common-mode voltage and the second output voltage, respectively, during the output phase.

Another aspect of the present disclosure provides a method for generating a differential output voltage between first and second output voltages that is double a differential input voltage between first and second input voltages, the method comprising, for each of at least one constituent voltage doubler: coupling first and second terminals of a first capacitor to the first and second input voltages, respectively, during a charging phase of the constituent voltage doubler; coupling first and second terminals of a second capacitor to the first and second input voltages, respectively, during the charging phase; coupling the first and second terminals of the first capacitor to the first output voltage and a common-mode voltage, respectively, during an output phase of the constituent voltage doubler; and coupling the first and second terminals of the second capacitor to the common-mode voltage and the second output voltage, respectively, during the output phase.

Yet another aspect of the present disclosure provides an apparatus comprising a differential voltage doubler for generating a differential output voltage between first and second output voltages that is double a differential input voltage between first and second input voltages, the voltage doubler comprising at least one constituent voltage doubler, each of the at least one constituent voltage doubler comprising: a first capacitor; a second capacitor; means for charging the first and second capacitors to the differential input voltage during a charging phase of the constituent voltage doubler; and means for stacking the first and second capacitors in series to generate the differential output voltage during an output phase of the constituent voltage doubler, the differential output voltage having a prespecified common mode voltage.

DETAILED DESCRIPTION

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Figure 1:
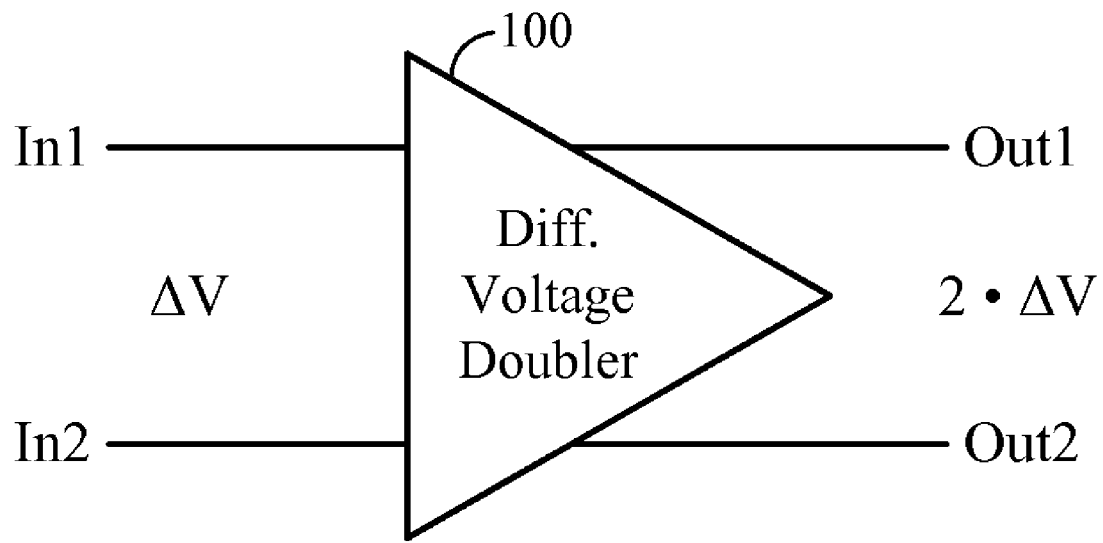
FIG. 1 illustrates the functionality of a differential voltage doubler.

FIG. 1 illustrates the functionality of a differential voltage doubler 100. In FIG. 1, input voltages In1 and In2 having a voltage difference $\Delta V$ are provided to the differential voltage doubler 100. The differential voltage doubler 100 generates output voltages Out1 and Out2 having a voltage difference $2 \cdot \Delta V$, i.e., twice the input voltage difference $\Delta V$.

Figure 2:
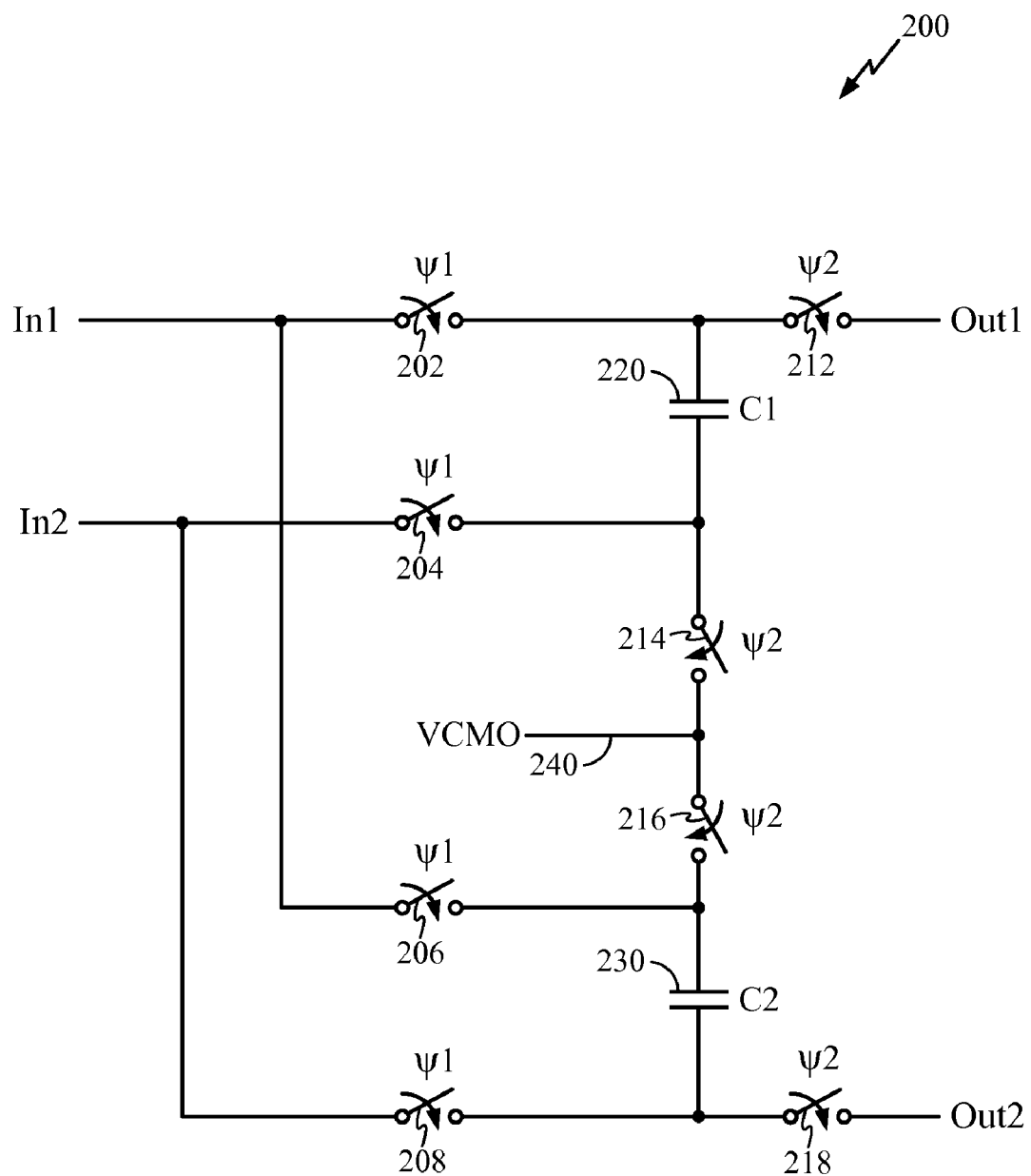
FIG. 2 illustrates an exemplary embodiment of a constituent differential voltage doubler according to the present disclosure.

FIG. 2 illustrates an exemplary embodiment of a constituent differential voltage doubler 200 according to the present disclosure.

The doubler 200 includes a first capacitor C1 220 and a second capacitor C2 230. The terminals of the capacitors C1 220 and C2 230 are selectively coupled to a plurality of switches.

A first plurality of switches 202, 204, 206, 208 is controlled by a first signal $\psi 1$. When $\psi 1$ is HIGH, the corresponding switches are closed; when $\psi 1$ is LOW, the corresponding switches are open.

Similarly, a second plurality of switches 212, 214, 216, 218 is controlled by a second signal $\psi 2$. When $\psi 2$ is HIGH, the corresponding switches are closed; when $\psi 2$ is LOW, the corresponding switches are open. In the exemplary embodiment, $\psi 1$ and $\psi 2$ are chosen such that the intervals during which each signal is HIGH are mutually non-overlapping, i.e., when $\psi 1$ is HIGH then $\psi 2$ is LOW, and when $\psi 2$ is HIGH then $\psi 1$ is LOW.

Figure 3:
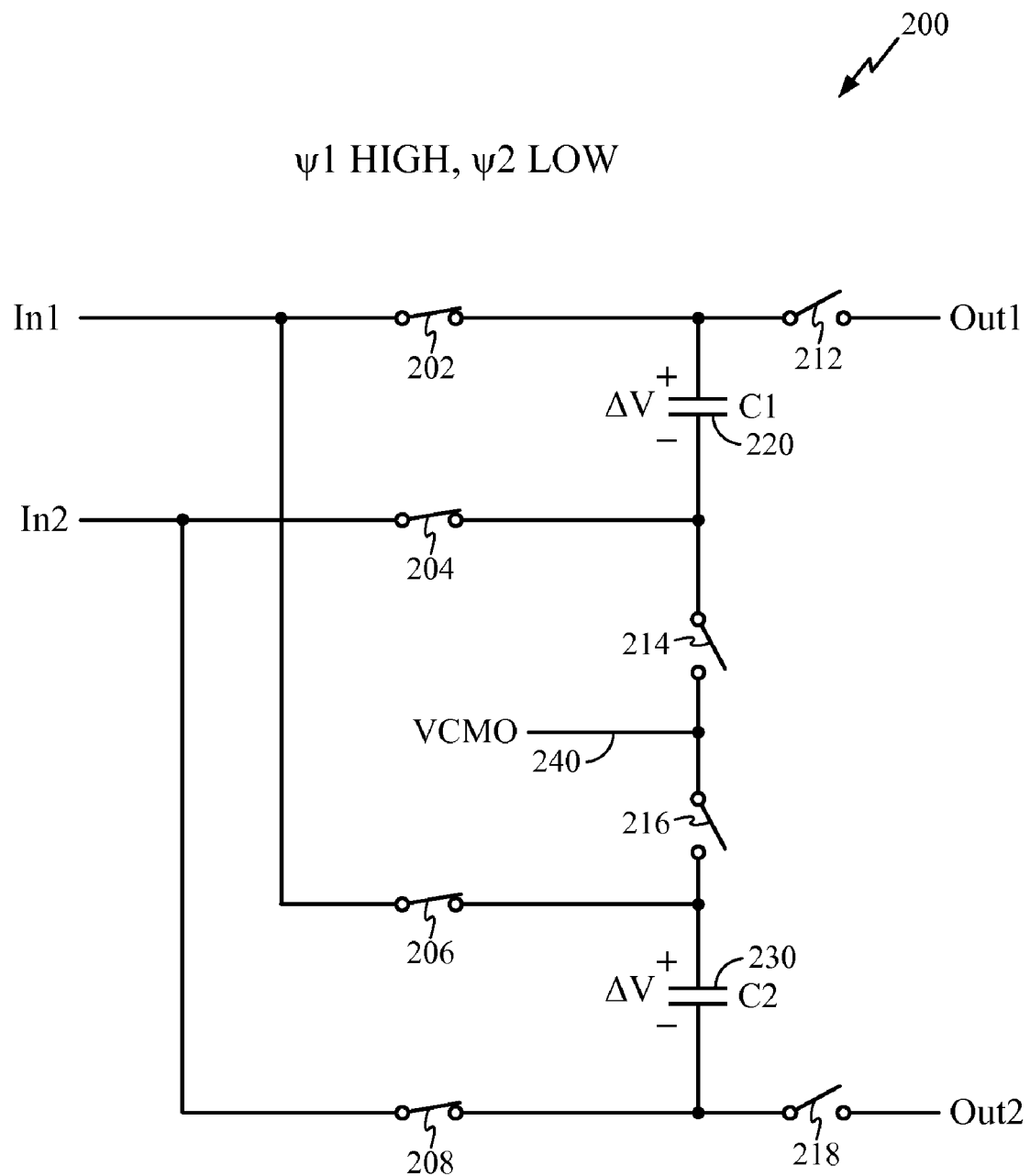
FIG. 3 illustrates the operation of the constituent voltage doubler when $\psi 1$ is HIGH and $\psi 2$ is LOW, i.e., during a "charging" phase of the constituent voltage doubler.
Figure 4:
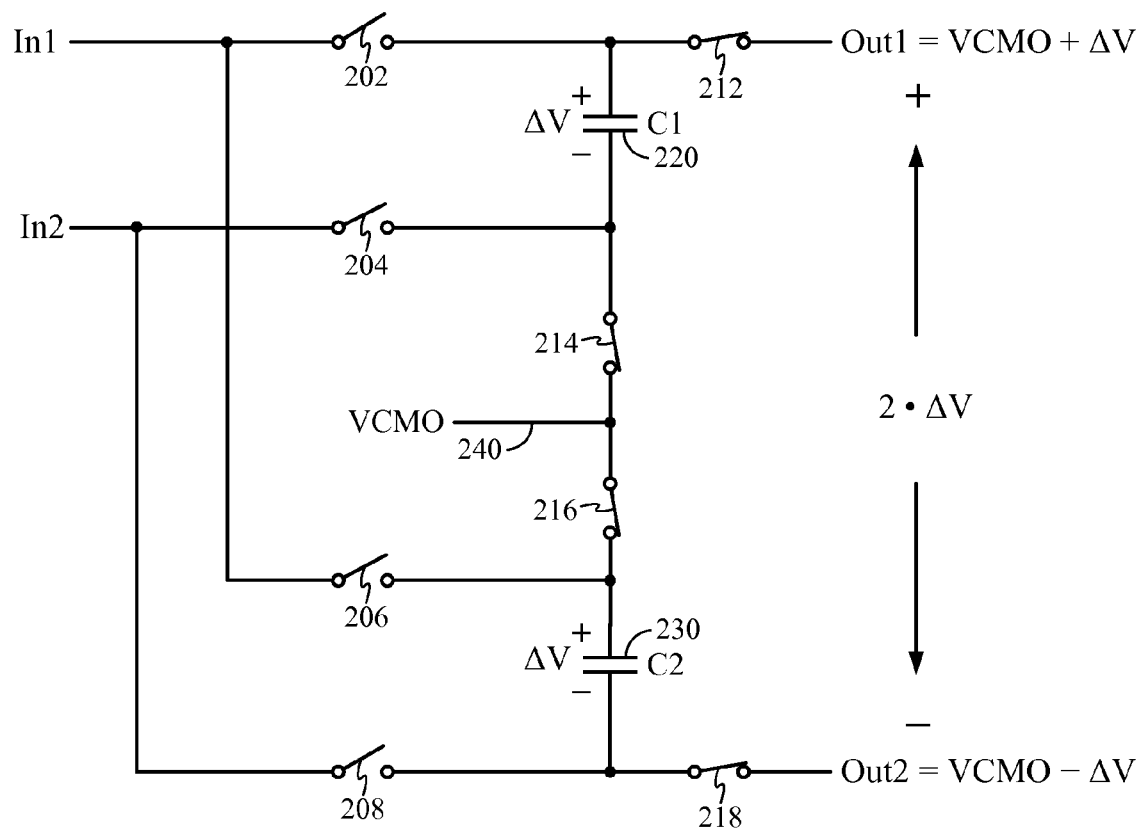
FIG. 4 illustrates the operation of the constituent voltage doubler when $\psi 1$ is LOW and $\psi 2$ is HIGH, i.e., during an "output" phase of the constituent voltage doubler.

FIGS. 3 and 4 illustrate the dynamic operation of the constituent voltage doubler 200.

FIG. 3 illustrates operation when $\psi 1$ is HIGH and $\psi 2$ is LOW, i.e., during a "charging" phase of the constituent voltage doubler 200. In FIG. 3, switches 202, 204, 206, 208 are closed, while switches 212, 214, 216, 218 are open. Switches 202, 204, 206, 208 couple the terminals of both capacitors C1 220 and C2 230 to the input voltages In1 and In2. This coupling charges each capacitor C1 220 and C2 230 to a voltage $\Delta V = In1 - In2$ after a finite charging time.

In an exemplary embodiment, the input voltages In1 and In2 may be supplied by a source having current drive capability. For example, the input voltages In1 and In2 may be coupled to the output of a transimpedance amplifier (TIA) (not shown).

FIG. 4 illustrates operation when $\psi 1$ is LOW and $\psi 2$ is HIGH, i.e., during an "output" phase of the constituent voltage doubler 200. In FIG. 4, switches 202, 204, 206, 208 are open, while switches 212, 214, 216, 218 are closed.

Switch 212 couples one terminal of C1 220 to the first output voltage Out1, while switch 214 couples the other terminal of C1 220 to a DC voltage level VCMO 240. As C1 220 is assumed to be already charged to a voltage of $\Delta V$, the voltage level of Out1 is $VCMO + \Delta V$.

Similarly, switch 218 couples one terminal of C1 220 to the second output voltage Out2, while switch 216 couples the other terminal of C2 230 to the DC voltage level VCMO 240. As C2 230 is assumed to be already charged to a voltage of $\Delta V$, the voltage level of Out2 is $VCMO - \Delta V$. The net differential output voltage Out1−Out2 during the output phase is thus seen to be $2 \cdot \Delta V$.

One of ordinary skill in the art will appreciate that by stacking the capacitors C1 220 and C2 230 in series during the output phase, the differential output voltage is double the differential input voltage. Furthermore, by coupling the common terminal of the capacitors C1 220, C2 230 to a fixed DC voltage level VCMO 240 during the output phase, the common-mode voltage level of the differential output is kept well-defined.

In an exemplary embodiment, the generated differential output voltage of the constituent voltage doubler 200 may supply loading stages (not shown) following the voltage doubler.

Note the constituent voltage doubler 200 provides a doubled differential output voltage $2 \cdot \Delta V$ to voltages Out1 and Out2 during the output phase but not the charging phase. According to an aspect of the present disclosure, two or more complementary constituent voltage doublers may be combined to provide a doubled differential output voltage that is available during multiple non-overlapping output phases of the constituent voltage doublers, as further described with reference to FIG. 5.

Figure 5:
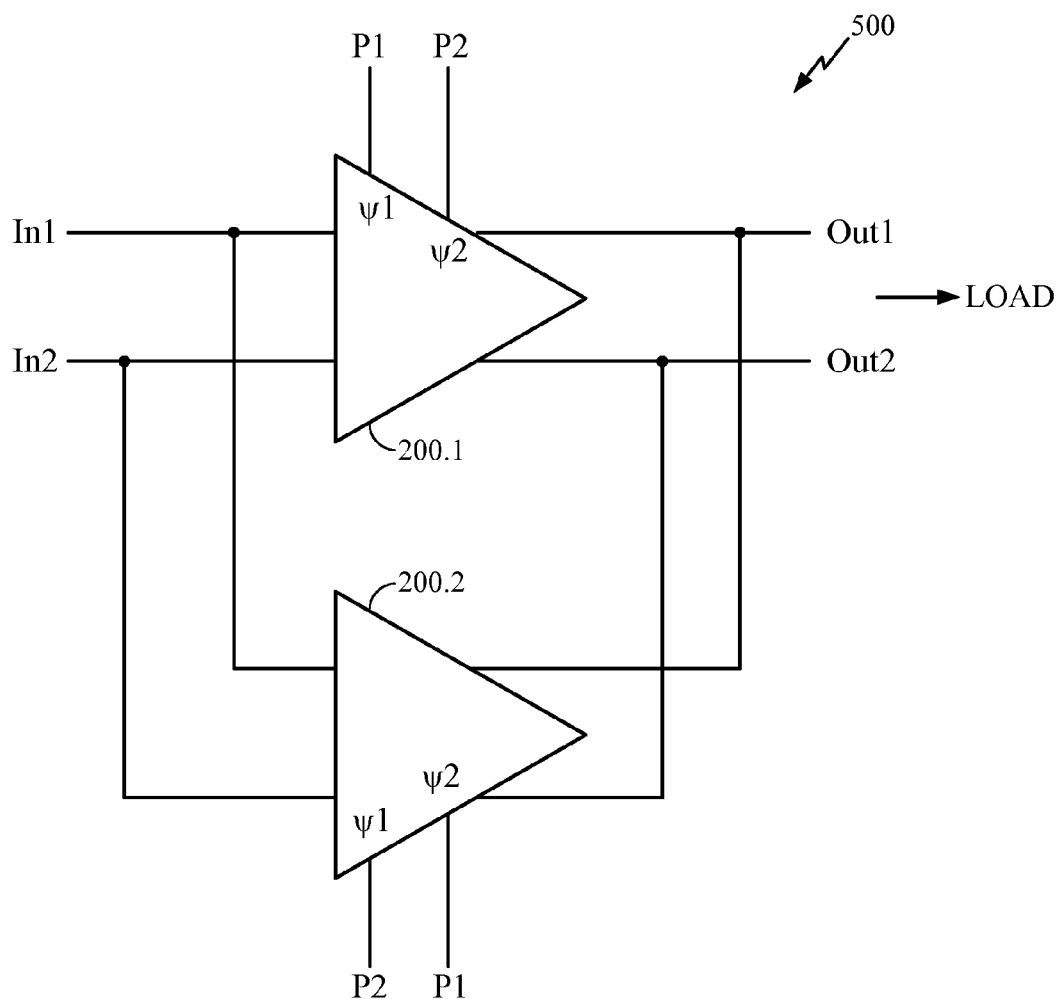
FIG. 5 illustrates an exemplary embodiment of a voltage doubler wherein two constituent voltage doublers are coupled in parallel.
Figure 5A:
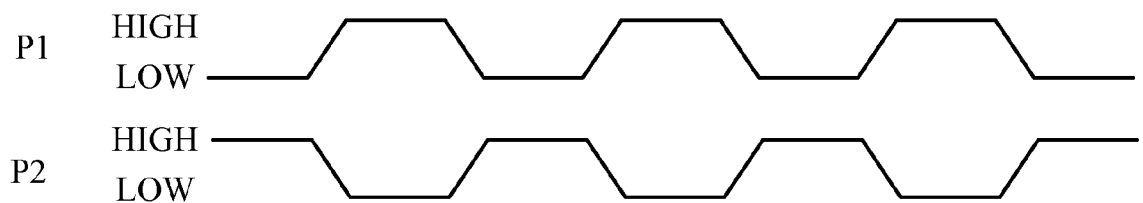
FIG. 5A shows the phase relationship of the clock signals P1 and P2.

FIG. 5 illustrates an exemplary embodiment of a voltage doubler 500 wherein two constituent voltage doublers 200.1 and 200.2 are coupled in parallel. The constituent voltage doublers 200.1 and 200.2 are configured such that the charging phase of 200.1 corresponds to the output phase of 200.2, while the output phase of 200.1 corresponds to the charging phase of 200.2. In the exemplary embodiment shown, clock signals P1 and P2 are provided to the $\psi 1$ and $\psi 2$ signal inputs, respectively, of constituent voltage doubler 200.1, and to the $\psi 2$ and $\psi 1$ signal inputs, respectively, of constituent voltage doubler 200.2. FIG. 5A shows the phase relationship of the clock signals P1 and P2. Note when P1 is HIGH, P2 is LOW, and when P2 is HIGH, P1 is LOW.

By providing two constituent voltage doublers 200.1, 200.2 as shown, the circuitry 500 generates a doubled differential voltage output that is available over the output phases of both constituent voltage doublers. One of ordinary skill in the art will appreciate that in alternative exemplary embodiments, more than two constituent voltage doublers may also be provided. For example, in an exemplary embodiment (not shown), three constituent voltage doublers may be coupled in parallel, such that the output phase of each constituent voltage doubler is made non-overlapping with the output phase of the other two constituent voltage doublers. The proper configurations of the clock signals for driving $\psi 1$ and $\psi 2$ of each constituent voltage doubler in such alternative exemplary embodiments utilizing more than two constituent voltage doublers are readily derivable by one of ordinary skill in the art in light of the present disclosure. Such alternative exemplary embodiments are contemplated to be within the scope of the present disclosure.

Figure 6:
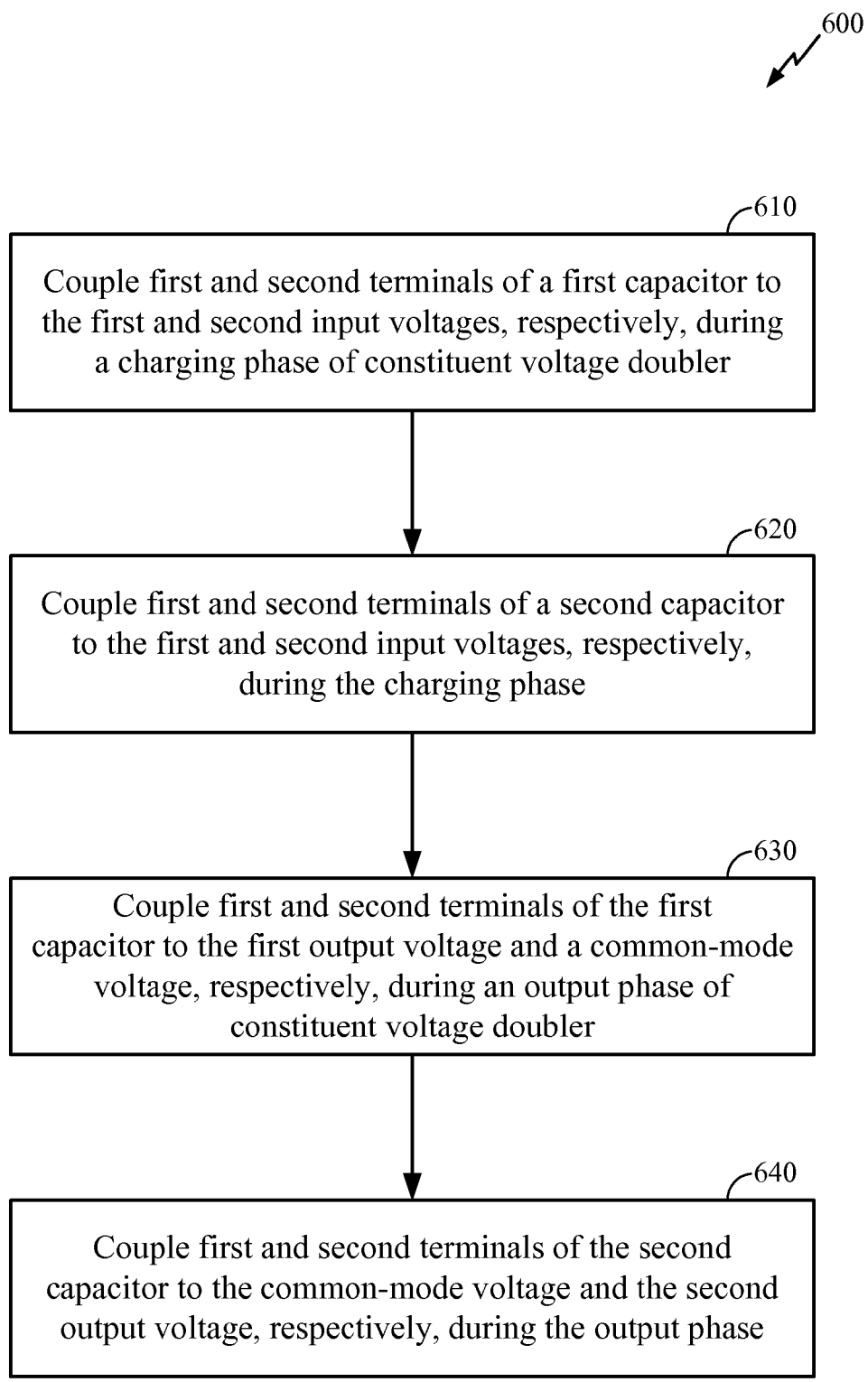
FIG. 6 illustrates an exemplary embodiment of a method 600 according to the present disclosure.

FIG. 6 illustrates an exemplary embodiment of a method 600 according to the present disclosure. Note the method 600 is shown for illustrative purposes only, and is not meant to restrict the scope of the present disclosure to any particular method shown.

At step 610, first and second terminals of a first capacitor are coupled to the first and second input voltages, respectively, during a charging phase of the constituent voltage doubler.

At step 620, first and second terminals of a second capacitor are coupled to the first and second input voltages, respectively, during the charging phase.

At step 630, the first and second terminals of the first capacitor are coupled to the first output voltage and a common-mode voltage, respectively, during an output phase of the constituent voltage doubler.

At step 640, the first and second terminals of the second capacitor are coupled to the common-mode voltage and the second output voltage, respectively, during the output phase.

Based on the teachings described herein, it should be apparent that an aspect disclosed herein may be implemented independently of any other aspects and that two or more of these aspects may be combined in various ways. The techniques described herein may be implemented in hardware, software, firmware, or any combination thereof If implemented in hardware, the techniques may be realized using digital hardware, analog hardware or a combination thereof If implemented in software, the techniques may be realized at least in part by a computer-program product that includes a computer readable medium on which one or more instructions or code is stored.

By way of example, and not limitation, such computer-readable media can comprise RAM, such as synchronous dynamic random access memory (SDRAM), read-only memory (ROM), non-volatile random access memory (NVRAM), ROM, electrically erasable programmable read-only memory (EEPROM), erasable programmable read-only memory (EPROM), FLASH memory, CD-ROM or other optical disk storage, magnetic disk storage or other magnetic storage devices, or any other tangible medium that can be used to carry or store desired program code in the form of instructions or data structures and that can be accessed by a computer.

The instructions or code associated with a computer-readable medium of the computer program product may be executed by a computer, e.g., by one or more processors, such as one or more digital signal processors (DSPs), general purpose microprocessors, ASICs, FPGAs, or other equivalent integrated or discrete logic circuitry.

A number of aspects and examples have been described. However, various modifications to these examples are possible, and the principles presented herein may be applied to other aspects as well. These and other aspects are within the scope of the following claims.

The invention claimed is:

1. An apparatus comprising:
a differential voltage doubler configured to receive a differential input voltage that includes a first input voltage and that further includes a second input voltage and further configured to generate a differential output voltage that includes a first output voltage and that further includes a second output voltage, the differential output voltage double the differential input voltage, the differential voltage doubler comprising a constituent voltage doubler, the constituent voltage doubler comprising:
a first capacitor having a first terminal and a second terminal, the first terminal configured to be coupled to the first input voltage during a charging phase of the constituent voltage doubler and the second terminal configured to be coupled to the second input voltage during the charging phase of the constituent voltage doubler, the first terminal further configured to be coupled to the first output voltage during an output phase of the constituent voltage doubler and the second terminal further configured to be coupled to a common-mode voltage during the output phase of the constituent voltage doubler, the output phase non-overlapping in time with the charging phase; and
a second capacitor having a third terminal and a fourth terminal, the third terminal configured to be coupled to the first input voltage during the charging phase and the fourth terminal configured to be coupled to the second input voltage during the charging phase, the third terminal further configured to be coupled to the common-mode voltage during the output phase and the fourth terminal further configured to be coupled to the second output voltage during the output phase.

2. The apparatus of claim 1, wherein the constituent voltage doubler further comprises a plurality of switches configured to select couplings of the first terminal, the second terminal, the third terminal, and the fourth terminal during the charging phase and during the output phase.

3. The apparatus of claim 1, wherein the differential voltage doubler further comprises a second constituent voltage doubler, the output phase of the constituent voltage doubler and a second output phase of the second constituent voltage doubler being non-overlapping in time.

4. The apparatus of claim 3, wherein the differential voltage doubler further comprises a third constituent voltage doubler, a third output phase of the third constituent voltage doubler being non-overlapping in time with the output phase of the constituent voltage doubler and with the second output phase of the second constituent voltage doubler.

5. A method comprising:
generating, by a differential voltage doubler and based on a differential input voltage that includes a first input voltage and that further includes a second input voltage, a differential output voltage that includes a first output voltage and that further includes a second output voltage, wherein the differential voltage doubler includes a constituent differential voltage doubler, and wherein generating the differential output voltage comprises:
coupling a first terminal of a first capacitor to the first input voltage during a charging phase of the constituent voltage doubler and coupling a second terminal of the first capacitor to the second input voltage during the charging phase;
coupling a third terminal of a second capacitor to the first input voltage during the charging phase and coupling a fourth terminal of the second capacitor to the second input voltage during the charging phase;
coupling the first terminal to the first output voltage during an output phase of the constituent voltage doubler and coupling the second terminal to a common-mode voltage during the output phase; and
coupling the third terminal to the common-mode voltage during the output phase and coupling the fourth terminal to the second output voltage during the output phase.

6. The method of claim 5, wherein the differential voltage doubler further comprises a second constituent voltage doubler, the output phase of the constituent voltage doubler being non-overlapping with a second output phase of the second constituent voltage doubler.

7. The method of claim 6, wherein the differential voltage doubler further comprises a third constituent voltage doubler, a third output phase of the third constituent voltage doubler being non-overlapping with the output phase of the constituent voltage doubler and with the second output phase of the second constituent voltage doubler.

8. The method of claim 5, wherein a magnitude of the differential output voltage is double a magnitude of the differential input voltage.

9. The method of claim 5, wherein the common-mode voltage is a fixed direct-current (DC) voltage.

10. The method of claim 5, wherein the output phase is non-overlapping in time with the charging phase.

11. The method of claim 5, wherein during at least a portion of the output phase the first terminal is coupled to the first output voltage while the second terminal is coupled to the common-mode voltage.

12. An apparatus comprising:
a differential voltage doubler configured to receive a differential input voltage that includes a first input voltage and that further includes a second input voltage and further configured to generate a differential output voltage that includes a first output voltage and that further includes a second output voltage, the differential voltage doubler comprising a constituent voltage doubler, the constituent voltage doubler comprising:
a first capacitor;
a second capacitor;
means for coupling the first capacitor and the second capacitor in parallel to charge the first capacitor and the second capacitor according to the differential input voltage during a charging phase of the constituent voltage doubler; and means for coupling the first capacitor and the second capacitor in series to generate the differential output voltage during an output phase of the constituent voltage doubler, a commonly coupled terminal of the first capacitor and of the second capacitor being coupled to a common-mode voltage.

13. The apparatus of claim 12, wherein a magnitude of the differential output voltage is double a magnitude of the differential input voltage.

14. The apparatus of claim 12, wherein the common-mode voltage is a fixed direct-current (DC) voltage.

15. The apparatus of claim 12, wherein the output phase is non-overlapping in time with the charging phase.

16. The apparatus of claim 12, wherein during at least a portion of the output phase the first terminal is coupled to the first output voltage while the second terminal is coupled to the common-mode voltage.

17. An apparatus comprising:
a differential voltage doubler configured to receive a differential input voltage that includes a first input voltage and that further includes a second input voltage and further configured to generate a differential output voltage that includes a first output voltage and that further includes a second output voltage, wherein the differential output voltage is double the differential input voltage, the differential voltage doubler comprising a constituent voltage doubler, the constituent voltage doubler comprising:

a first capacitor;
a second capacitor;
means for charging the first capacitor and the second capacitor according to the differential input voltage during a charging phase of the constituent voltage doubler; and
means for coupling the first capacitor and the second capacitor in series to generate the differential output voltage during an output phase of the constituent voltage doubler, the differential output voltage having a common-mode voltage,
wherein the differential voltage doubler further comprises a second constituent voltage doubler, the output phase of the constituent voltage doubler and a second output phase of the second constituent voltage doubler being non-overlapping in time.

18. The apparatus of claim 17, wherein the differential voltage doubler further comprises a third constituent voltage doubler, a third output phase of the third constituent voltage doubler being non-overlapping in time with the output phase of the constituent voltage doubler and with the second output phase of the second constituent voltage doubler.

19. The apparatus of claim 18, wherein the constituent voltage doubler, the second constituent voltage doubler, and the third constituent voltage doubler are coupled in parallel.

20. The apparatus of claim 17, wherein the constituent voltage doubler is coupled in parallel to the second constituent voltage doubler.

* * * * *